(12) United States Patent
Malone et al.

(10) Patent No.: US 6,935,419 B2
(45) Date of Patent: Aug. 30, 2005

(54) HEAT SINK APPARATUS WITH AIR DUCT

(75) Inventors: Christopher G. Malone, Folsom, CA (US); Ryan Abbott, Cupertino, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 44 days.

(21) Appl. No.: 10/080,002

(22) Filed: Feb. 20, 2002

(65) Prior Publication Data

US 2003/0155106 A1 Aug. 21, 2003

(51) Int. Cl.[7] ............................. F28F 7/00; F28F 13/00
(52) U.S. Cl. ..................... 165/185; 165/80.3; 165/146
(58) Field of Search ............................. 165/185, 80.3, 165/121, 122, 146, 147; 361/690, 697–703; 174/16.3; 257/717, 722

(56) References Cited

U.S. PATENT DOCUMENTS

| | | | | |
|---|---|---|---|---|
| 4,765,397 A | * | 8/1988 | Chrysler et al. ....... | 165/104.33 |
| 5,002,123 A | * | 3/1991 | Nelson et al. ............ | 165/80.3 |
| 5,077,601 A | * | 12/1991 | Hatada et al. ............ | 165/80.3 |
| 5,763,950 A | * | 6/1998 | Fujisaki et al. ............ | 361/697 |
| 5,957,194 A | * | 9/1999 | Azar .......................... | 165/80.3 |
| 6,288,899 B1 | * | 9/2001 | Smith ......................... | 361/690 |
| 6,304,445 B1 | * | 10/2001 | Bollesen .................... | 361/697 |
| 6,333,852 B1 | * | 12/2001 | Lin ............................. | 361/697 |
| 2002/0172008 A1 | * | 11/2002 | Mihalis ...................... | 361/697 |

* cited by examiner

*Primary Examiner*—Tho V. Duong

(57) ABSTRACT

A heat dissipating apparatus. In one embodiment, a heat dissipating apparatus is comprised of a heat sink device having a plurality of cooling fins coupled to the heat sink device. The heat sink device is adapted to be thermally coupled to a heat source. The plurality of cooling fins are adapted to dissipate heat generated by the heat source. An air duct is coupled with the heat sink device. The air duct is for directing an airflow to the cooling fins to increase dissipation of the heat.

11 Claims, 21 Drawing Sheets

700

Directing an airflow to circulate around a plurality of cooling fins, the plurality of cooling fins coupled to a heat sink device, the heat sink device adapted to be thermally coupled to a heat source, the plurality of cooling fins adapted to dissipate heat generated by the heat source, the airflow directed around the plurality of cooling fins by an air duct coupled to the heat sink device.
702

Minimizing the pressure drop of the airflow when the airflow comes in contacts the plurality of cooling fins.
704

FIG. 7

HEAT SINK APPARATUS WITH AIR DUCT

TECHNICAL FIELD

The present invention relates to heat sink design and implementation.

BACKGROUND ART

Advancements in electronic and computer technology have enabled continued miniaturization of associated components and circuitry. Accordingly, the physical characteristics, e.g., footprint, internal volume, etc., of the computer system have been proportionately reduced to realize those advancements.

Taking advantage of this reduction, many computer manufacturers are developing computer systems that include a multiple instancing of a single component, e.g., multiple microprocessors where previously a single microprocessor was disposed. While multiple instantiations of microprocessors can increase the processing power of the computer system into which they are integrated, it is appreciated that multiple microprocessors also increase the amount of heat generated within the computer system.

Excessive heat can have a detrimental effect upon the function and operation of a computer system. Unless the heat generated from within the computer system is properly dissipated, serious side effects, ranging from sporadic memory loss to total system failure, can occur. Additionally, with the components, circuitry, and physical characteristics of the computer system being reduced, available internal vertical space between components and internal volume space within the computer system are also reduced. In some instances, a reduction in internal volume space may compound the problem of insufficient heat dissipation.

In one attempt to provide additional cooling within a computer system, an additional cooling fan was designed to be plugged into an expansion slot located on the motherboard. While providing some additional internal airflow, this type of approach has shortcomings associated therewith. For example, if the computer system, in which the cooling fan card was to be placed, did not have an available expansion card, functionality of the computer system is reduced by necessitating removal of an inserted expansion card to provide an empty slot into which the fan card could be inserted. Additionally, because the cooling fan card is coupled to the motherboard, the ambient air within the computer system would be included in the increased airflow, which can, in many instances, be higher in temperature than that of air external of the computer system. Also, because expansion slots within a motherboard are commonly located distant from the microprocessor, the increased airflow is circuitously applied to the microprocessor, which, in many circumstances, may not provide sufficient cooling to the microprocessor. This can be especially prevalent with computer systems having multiple microprocessors, such as rack mount systems.

In another attempt, a larger heat sink with a greater surface area, e.g., taller cooling fins, for heat dissipation may be implemented. It is appreciated that a larger heat sink with taller cooling fins would inherently provide increased heat dissipation. However, in many instances, due to the constraints regarding available vertical space within today's computer systems, a larger heat sink is not a practical or viable solution to the problem. Further, in many instances, even a smaller, conventionally sized heat sink may not fit within the constraints of today's smaller sized computer systems and multiprocessor computer systems.

It is further appreciated that heat sinks are commonly configured with multiple cooling fins. For example, referring to Prior Art FIG. 1, air, e.g., air 2 is forced into heat sink 4 as indicated by airflow direction arrow 3. Heat sink 4 has a bank of cooling fins 5. Air 2 is forced about the surface area of cooling fins 5 providing heat transfer. It is appreciated, however, that the temperature of portions of air 2 which contact those portions of cooling fins 5 farther downstream from airflow 3 has been elevated, inherent to contacting portions of cooling fins 5 further upstream. In some instances, the downstream portions of cooling fins 5 cannot provide sufficient cooling of the now preheated air, which can effect the operation of a computer system.

Furthermore, if increasing the velocity of the airflow forced upon the cooling fins is attempted to provide adequate cooling, this attempt is not without shortcomings associated therewith. While the performance of a heat sink can increase as the velocity of the air passing over the cooling fins increases, with an increase in air velocity, or flow rate, there is an inherent increase in associated pressure drop. Because fans that are utilized to drive air across the cooling fins have a defined pressure drop versus a flow rate, there is a physical limit on the pressure drop a fan can deliver at a given flow rate. This can be addressed by utilizing larger or greater numbers of fins which, as described above, can negatively impact the density of the server or rack mount system. When the airflow contacts the upstream portions of the cooling fins, because of the increased velocity, an increased pressure drop occurs. An increased pressure drop can result in a decrease in volume of the air forced about the surface areas of the cooling fins and effectively reducing the velocity of the airflow, thus reducing the capacity of the cooling fins to dissipate heat.

Hence, many existing heat dissipation devices and methods do not provide sufficient heat dissipation.

DISCLOSURE OF THE INVENTION

Thus, embodiments of the present invention are drawn to providing a heat dissipation apparatus that is implementable within nearly any computer system, including computer systems that may have vertical or volume constraints. Embodiments of the present invention further provide air to cooling fins that has not been subject to preheating and which can provide increased airflow volume from an existing airflow generator. Embodiments of the present invention further provide a heat dissipation apparatus that can be manipulated to decrease effects of pressure drop associated with airflow velocity.

In one embodiment, a heat dissipating apparatus is comprised of a heat sink device having a plurality of cooling fins coupled to the heat sink device. The heat sink device is adapted to be thermally coupled to a heat source. The plurality of cooling fins are adapted to dissipate heat generated by the heat source. An air duct is coupled with the heat sink device. The air duct is for directing an airflow to the cooling fins to increase dissipation of the heat.

BRIEF DESCRIPTION OF THE DRAWINGS

The accompanying drawings, which are incorporated in and form a part of this specification, illustrate embodiments of the invention and, together with the description, serve to explain the principles of the invention:

FIG. 7 is a flow chart of a process of heat dissipation, in accordance with one embodiment of the present invention.

BEST MODES FOR CARRYING OUT THE INVENTION

A heat sink with lateral air channels for increased airflow and reduced air temperature is described. Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. In other instances, well known methods, procedures, components, and circuits have not been described in detail as not to unnecessarily obscure aspects of the present invention.

The present invention is discussed primarily in the context of providing an apparatus for dissipating the heat generated by an in use microprocessor. It is appreciated that microprocessors are available in many different configurations. One configuration can consist of a single microprocessor. Another configuration can consist of multiple microprocessors. Yet another configuration can consist of (a) microprocessor(s) accompanied by a power conditioning unit, commonly referred to as a power pod. It is appreciated that a power pod commonly generates less heat than the associated microprocessor. Embodiments of the present invention are well suited to provide heat dissipation to nearly all configurations. However, it is further appreciated that the present invention can be used with other types of devices that have the capability to generate sufficient amounts of heat requiring additional cooling, including but not limited to microprocessors.

Figure 1:
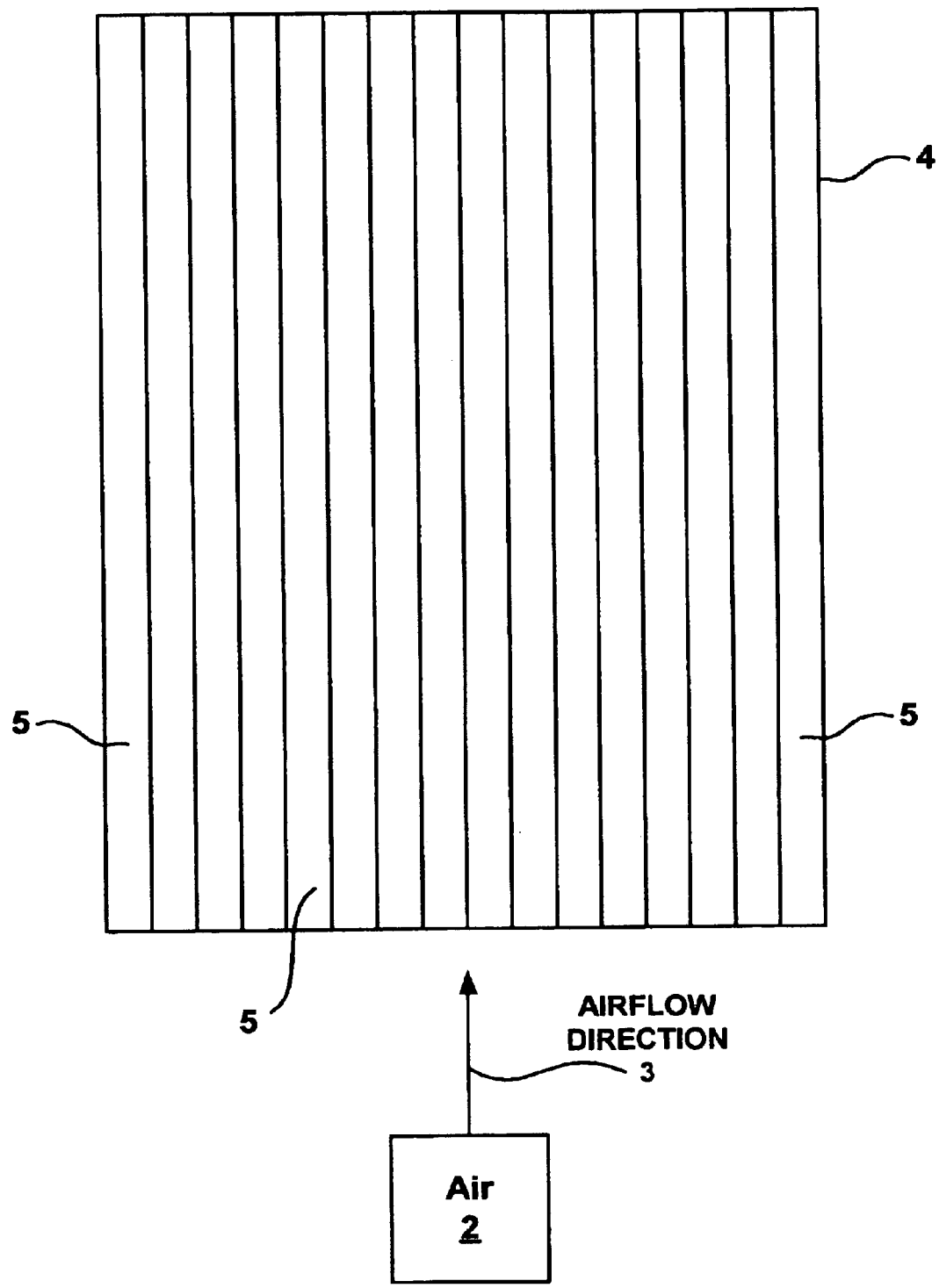
FIG. 1 is an illustration of a prior art heat sink.
Figure 2A:
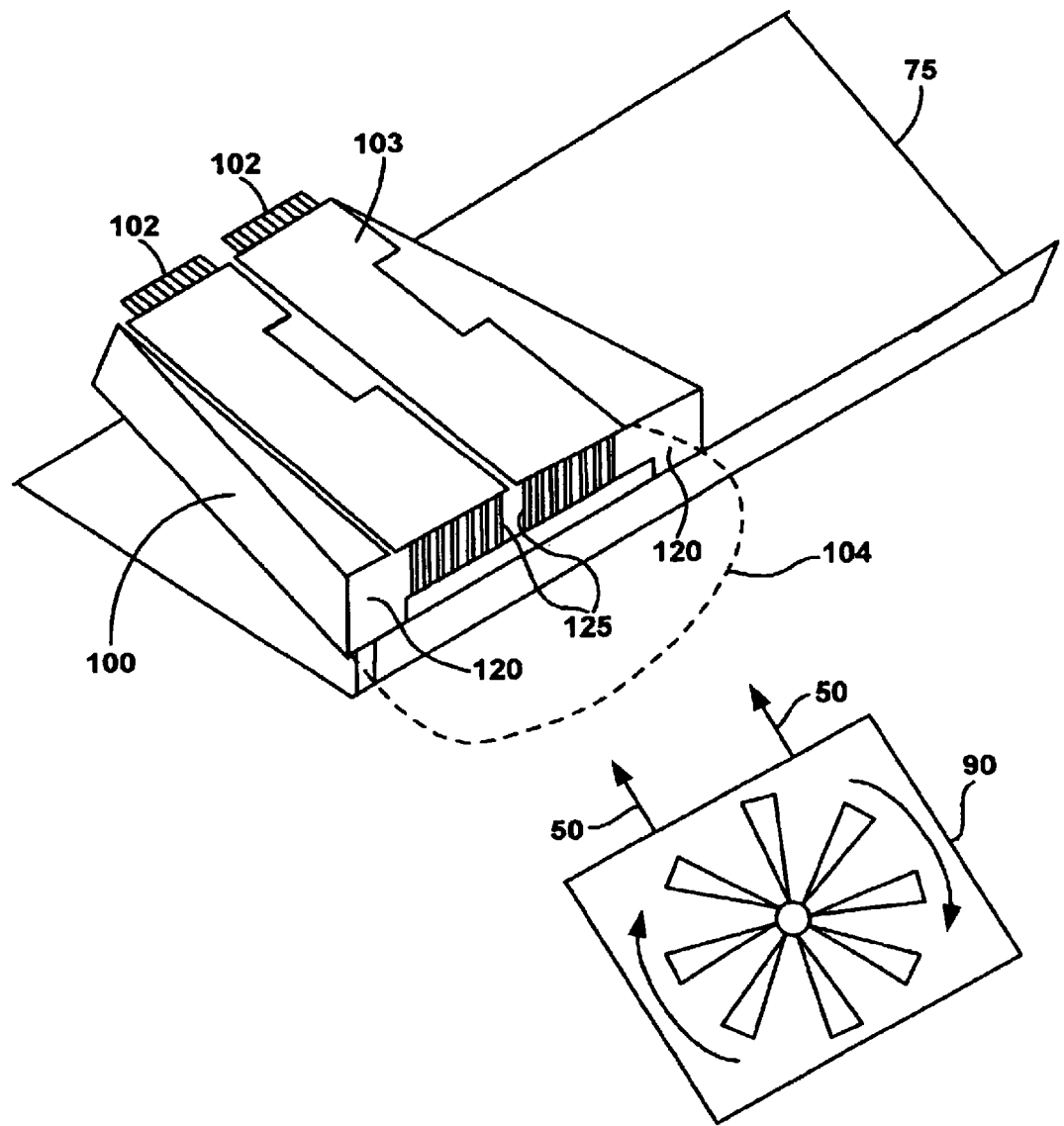
FIG. 2A is an illustration of heat sink assemblies disposed upon a motherboard, in accordance with one embodiment of the present invention.
Figure 2B:
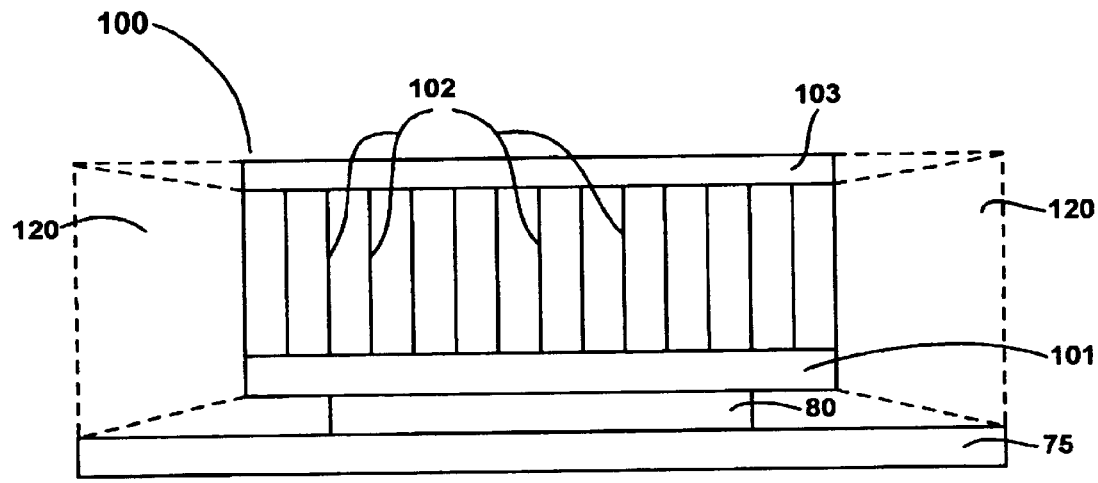
FIG. 2B is a cross-sectioned front-facing illustrated view of the upper heat sink assembly with air intake ducts, as shown in FIG. 2A, in accordance with one embodiment of the present invention.
Figure 3:
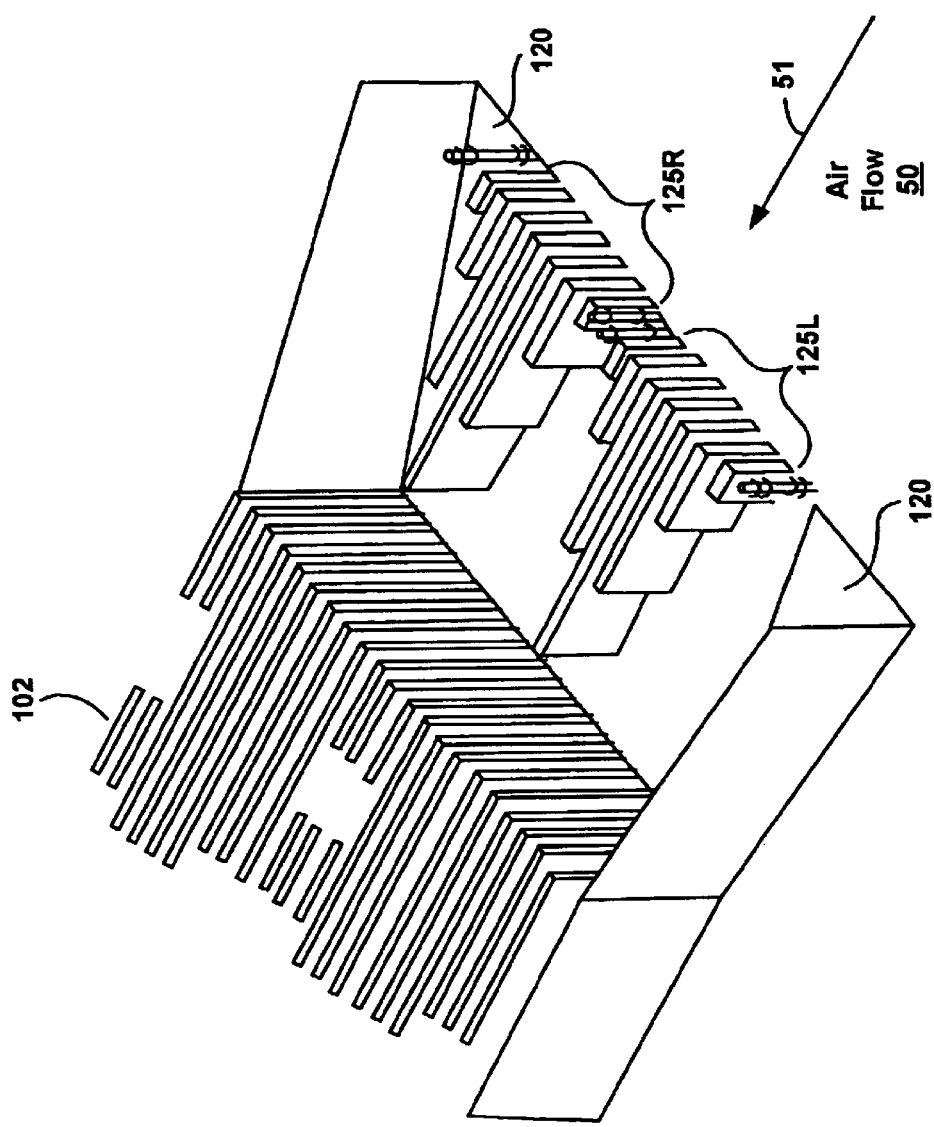
FIG. 3 is a top-angled illustrated view of the upper heat sink assembly of FIG. 2, shown with a top cover removed, showing the disposition of cooling fins and upstream fins, in accordance with one embodiment of the present invention.

FIG. 2A is an illustration of a PCB (printed circuit board) 75 upon which a microprocessor 80 (such as shown in FIG. 2B) is interposed between PCB 75 and a heat sink assembly 100. Heat sink assembly 100 is adapted to be thermally coupled to microprocessor 80, in one embodiment of the present invention. Heat sink assembly 100 provides heat dissipation to microprocessor 80 during operation and is adapted to receive an incoming airflow, e.g., airflow 50, via intake portion 104 (dotted line), in one embodiment of the present invention. Airflow 50 is generated by an airflow generating device, e.g., cooling fan 90. Cooling fins that provide heat dissipation, e.g., cooling fins 102 of FIG. 3, are located underneath top plate cover 103.

FIG. 2B is a cross-sectioned front-facing illustrated view of FIG. 2A, in accordance with one embodiment of the present invention. Starting at the bottom is PCB (printed circuit board) 75. Shown above PCB 75 is microprocessor 80, which is coupled to PCB 75 via a coupling mechanism, e.g., a socket and pin assembly, in one embodiment. Heat sink assembly 100, in one embodiment, is disposed above microprocessor 80 and is shown to include heat sink contact plate 101, which is adapted to be thermally coupled to microprocessor 80. Thermally coupling microprocessor 80 with contact plate 101 enables a transference of heat generated by microprocessor 80 to a plurality of cooling fins, e.g., cooling fins 102, shown as disposed above and coupled to heat sink contact plate 101. Cooling fins 102 are adapted to dissipate heat by providing surface areas around which a cooling air is flowed and, accordingly, cooling fins 102 are spaced far enough apart to allow proper airflow. Although such a specific heat sink configuration is shown in FIG. 2B, embodiments of the present invention are well suited to various alternative types of configurations (e.g., heat pipe containing heat sinks, heat sinks with large base structures, heat sinks without a contact plate, etc.).

Still referring to FIG. 2B, cooling fins 102 are manufactured from a material having physical properties conducive to the dissipation of heat. In one embodiment, cooling fins 102 are constructed out of aluminum. It is appreciated that alternative materials, analogously suited to provide heat dissipation, can be utilized in the construction of cooling fins 102.

In the present embodiment, an air ducting system, e.g., air duct 120, is provided to direct an airflow to areas of the microprocessor assembly where a greater amount of heat dissipation is needed. Specifically, with reference still to FIG. 2B, air intake ducts, e.g., air intake ducts 120 as indicated by dotted lines, are shown to have interposed there between heat sink apparatus 100 in one embodiment of the present invention. It is appreciated, that while in one embodiment of the present invention air intake ducts 120 are depicted on either side of heat sink assembly 100, relative to the horizontal axis, in another embodiment air intake ducts 120 are disposed in alternative configurations.

In accordance with another embodiment of the present invention, intake duct 120 can be disposed upon and coupled with the top and sides of heat sink apparatus 100, microprocessor 80 and PCB 75. In this example, incoming airflow that would pass above the heat sink is redirected onto heat sink apparatus 100, providing even more cooling air, thus increasing the amount of heat that can be dissipated.

In accordance with another embodiment of the present invention, air intake duct 120 can envelope the entire component assembly, e.g., PCB 75, microprocessor 80, and heat sink apparatus 100, as shown in FIG. 2A. In this embodiment, by increasing the amount of incoming airflow that can be circulated about heat sink apparatus 100, increased amounts of heat can be dissipated.

It is appreciated that the air ducts, e.g., air ducts 120 of the present invention are configured to provide a smooth transition for incoming airflow 50, thus reducing pressure drop. Because abrupt changes in airflow direction has detrimental effects thereof, the smooth transition provided by air ducts 120 of the present invention reduces pressure drop, thus effectively increasing airflow volume and velocity.

FIG. 3 is a cut-away illustration of a heat sink assembly, e.g. heat sink assembly 100 of FIG. 2A, shown removed from PCB 75 and with the top plate cover 103 removed. An incoming airflow, e.g., airflow 50 provided by air fan 90 of FIG. 2A is, in this example, flowing towards heat sink assembly 100, as indicated by arrow 51. Cooling fins 102 are disposed downstream from airflow 50, and are analogous to cooling fins 102 of FIG. 2B. Upstream fins, e.g., upstream fins 125l (left) and 125r (right) are disposed upstream to airflow 50 and adapted to reduce pressure drop associated with velocity of the incoming airflow thus providing a higher flow rate of incoming air.

Still referring to FIG. 3, there is a correlation between airflow, e.g., airflow 50, as provided by an air fan, e.g., air fan 90 of FIG. 2A, and acoustic noise. The speed at which an air fan rotates is a primary factor in generating acoustic noise. As such, the faster an air fan rotates a greater amount of acoustic noise is generated. Conversely, air fans rotating at a slower speed generate less acoustic noise. While it is beneficial to provide airflow with a minimum of acoustic noise, it is appreciated that air fans rotating at such slow speeds may not provide sufficient airflow to properly dissipate heat generated by a microprocessor.

Additionally, in today's newer computer systems, such as rack mount servers for data centers, companies are now putting the most amount of processing power (microprocessors) into the smallest volume possible, e.g., locating as many microprocessors as possible in the least amount of real estate and using a minimum of volume. Further, existing fans and/or smaller fans complying with reduced available space are commonly implemented. To provide the necessary air to maintain proper operating temperature of the microprocessors, air fans are commonly run at maximum speed to provide the largest amount of airflow.

In one embodiment of the present invention, as shown in FIG. 3, upstream fins 125 (l, r, respectively) are adapted, while maintaining air fan speed, to reduced pressure drop, thus reducing acoustic noise, thus effectively increasing incoming airflow volume and velocity. By reducing pressure drop associated with airflow velocity, heat sink upstream fins 125l and 125r enable greater airflow volume around cooling fins 102.

Still referring to FIG. 3 which depicts upstream fins 125l and 125r interposed between incoming airflow 50, as indicated by direction arrow 51, and cooling fins 102, in one embodiment of the present invention. By reducing airflow resistance, cooling fins 102 receive a larger volume of air, enabling cooling fins 102 to function more efficiently, dissipating a greater amount of heat.

In one embodiment, upstream fins 125 of FIG. 3 are configured in two banks of fins, 125l (left) and 125r (right). It is appreciated that in another embodiment, upstream fins 125 can be configured as one bank, and in another embodiment configured in three, or more, banks. As shown in FIG. 3, upstream fins 125 (either left or right), in one embodiment, are configured in a shaped pattern resembling a V, with some fins longer than others and which are oriented parallel to an incoming airflow.

Figure 4A:
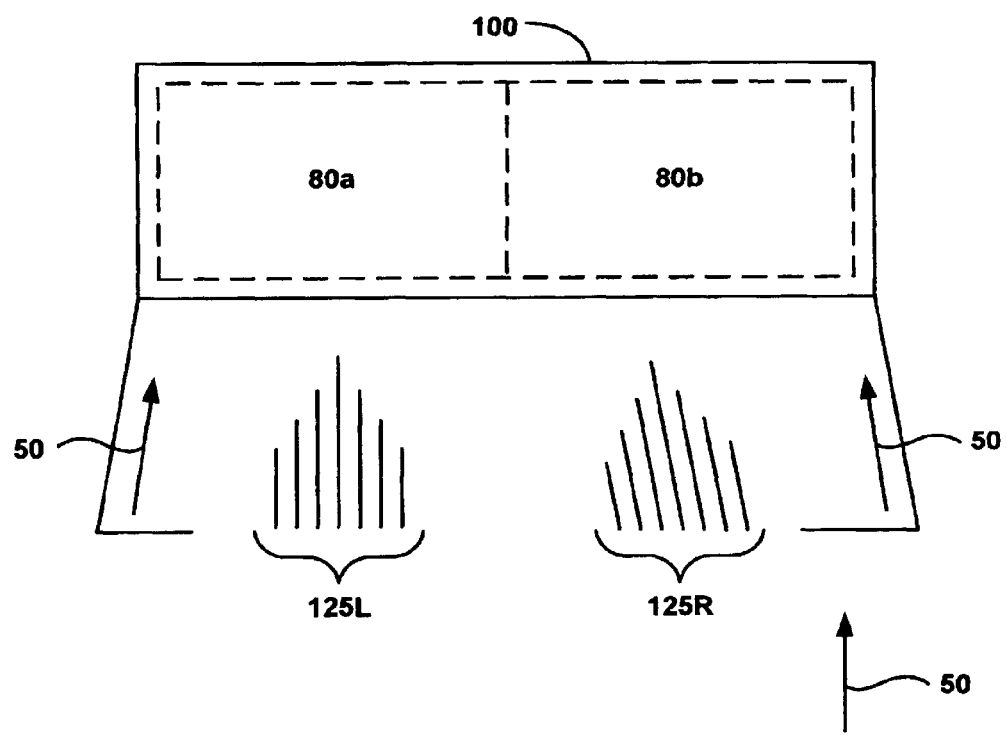
FIG. 4A is an illustration of upstream fins in an alternative configuration, in accordance with one embodiment of the present invention.
Figure 4B:
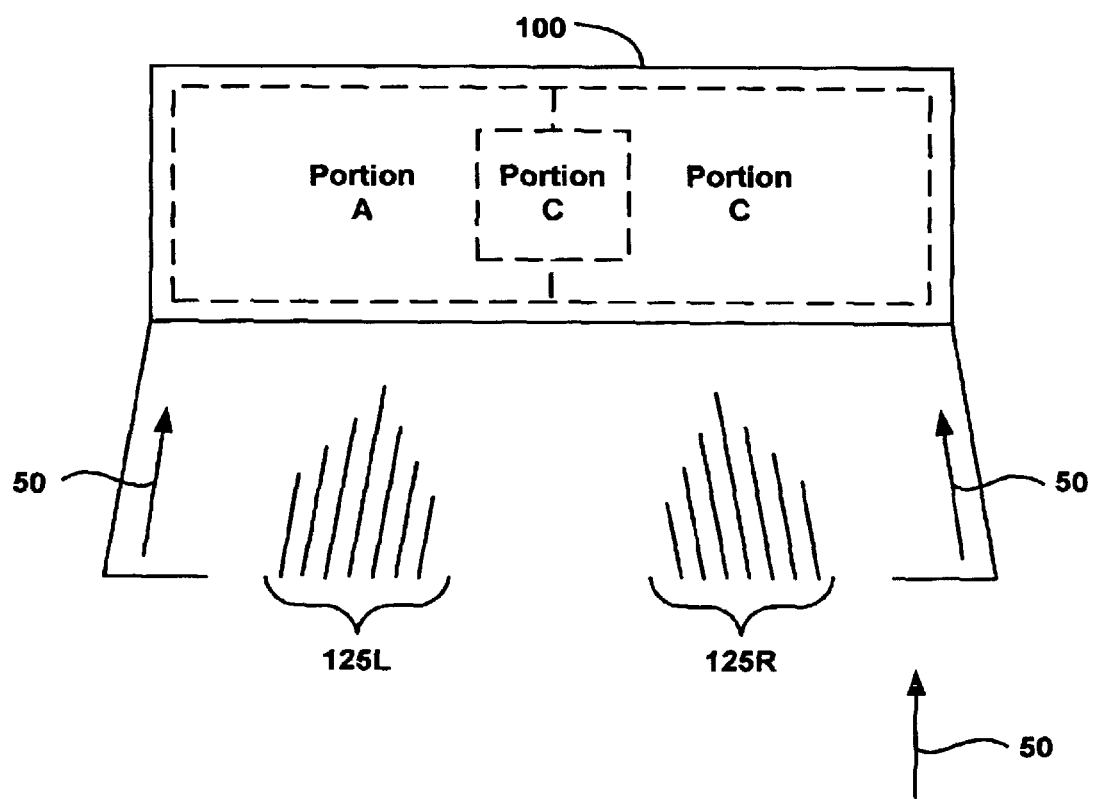
FIG. 4B is an illustration of upstream fins in another alternative configuration, in accordance with embodiments of the present invention.
Figure 4C:
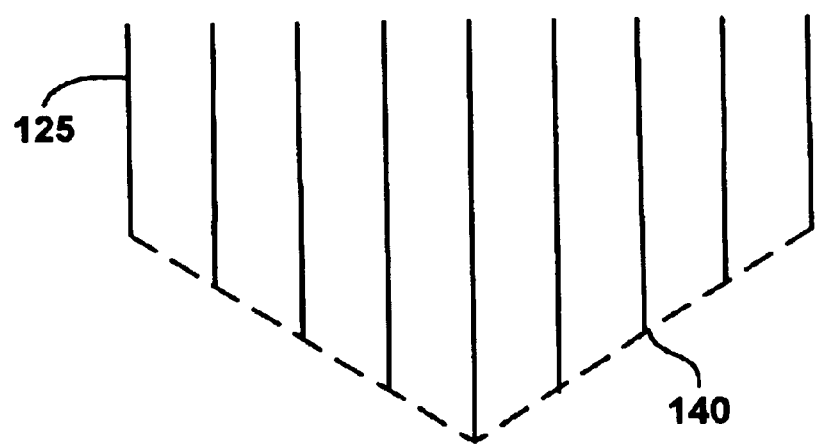
FIG. 4C is an illustration of upstream fins in an alternative configuration, in accordance with one embodiment of the present invention.
Figure 4D:
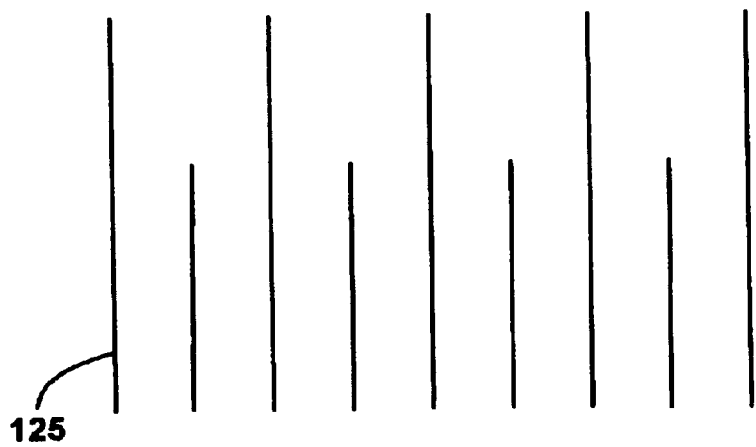
FIG. 4D is an illustration of upstream fins in an alternative configuration, in accordance with one embodiment of the present invention.
Figure 4E:
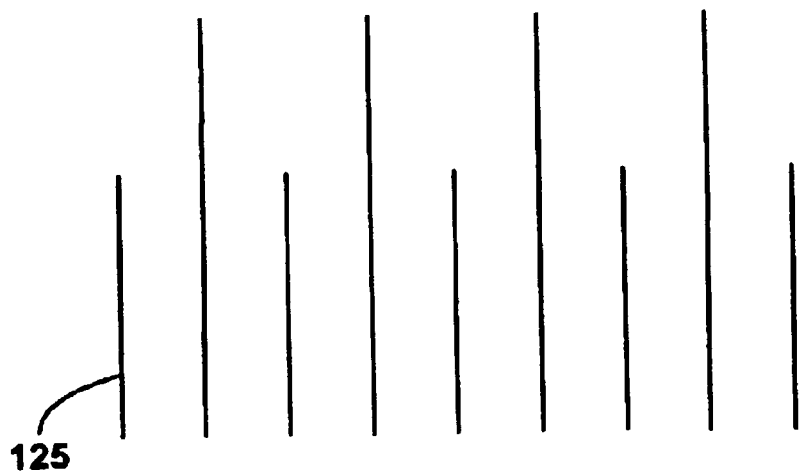
FIG. 4E is an illustration of upstream fins in an alternative configuration, in accordance with one embodiment of the present invention.
Figure 4F:
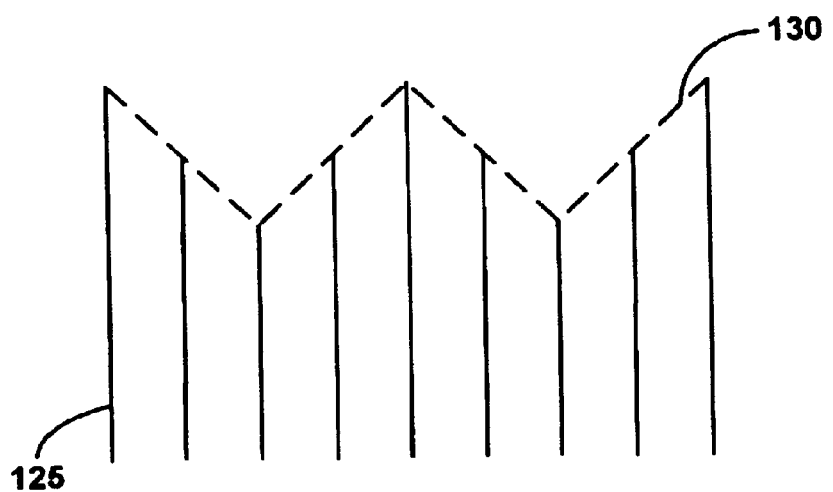
FIG. 4F is an illustration of upstream fins in an alternative configuration, in accordance with one embodiment of the present invention.

Still referring to FIG. 3, it is appreciated that upstream fins 125, in another embodiment, may be configured in many different shaped patterns, including but not limited to the V shaped pattern shown, (e.g., a W shaped pattern as shown in FIG. 4F). Also appreciated is that alternative fin lengths may be utilized, including but not limited to those lengths shown in FIG. 3. In one embodiment, the length of all of the upstream fins may be analogous.

While upstream fins 125 of FIG. 3 are depicted oriented parallel to an incoming airflow in one embodiment of the present invention, in another embodiment upstream fins 125 can be alternatively oriented. FIGS. 4A and 4B depict upstream fins 125 in alternative orientations for directing portions of oncoming airflow to those portions of cooling fins 102 that are dissipating greater amounts of heat.

Referring to the upstream fins as described above, it is appreciated that upstream fins 125 can be configured in a nearly endless variety of: a) directing angles, relative to an airflow; b) fin shapes (e.g., rectangular, tapered at one end, tapered at both ends); c) fin patterns, e.g., a V as shown in FIG. 3; and d) number of upstream fins, e.g., seven fins per bank as described in FIG. 3.

In FIG. 4A, heat sink apparatus 100 is thermally coupled to a microprocessor, e.g., microprocessor 80 as indicated by a dotted line, in one embodiment. Microprocessor 80 has one portion operating at a higher power (requiring more cooling) than another portion, for example portion 80a operates at a higher power than portion 80b. In another example, the heat sink apparatus can be utilized by components having different power levels. Thus, in one embodiment of the present invention, more airflow is to be directed to those portions of heat sink 100, (cooling fins 102 thereof) that are located above portion 80a. Angling upstream fins 125*l* and 125*r* more toward portion 80*a* increases the amount of air available to traverse cooling fins 102, thus increasing the amount of heat that can be dissipated. Conversely, if portion 80*b* of microprocessor 80 was the higher power portion, upstream fins 125*l* and 125*r* would be appropriately re-angled.

In FIG. 4B, heat sink apparatus 100 is disposed upon a microprocessor 80 analogous to FIG. 4A. In this example, microprocessor 80 has a portion 80*c*, in the center that operates at higher temperature than other portions, e.g., portions 80*a* and 80*b*. Thus, upstream fins 125*l* and 125*r* are configured to provide a convergence of incoming airflow 50 directed toward center portion c, thus increased heat dissipation performance of those cooling fins located above portion 80*c*. While cooling fins 102 have been shown in a single bank of fins, heat sink apparatus 100 may be configured with multiple banks of cooling fins, as will be described in FIGS. 5B, and 5C.

FIG. 4C is an illustration of upstream fins 125 shown in an airflow resistance minimizing pattern, in one embodiment of the present invention. In this example, upstream fins 125 are in a V shape, as indicated by dotted line 140. Although nine upstream fins are depicted in FIG. 4C, nearly any number of upstream fins can be utilized. It is appreciated that the pitch of upstream fins can be finer or less fine. It is further appreciated that in other embodiments, the pattern of the upstream fins can be of nearly any shape, as will be shown in the following figures, FIGS. 4D–4J.

FIG. 4D is an illustration of upstream fins 125 shown in an airflow resistance minimizing pattern, in one embodiment of the present invention. In this example, upstream fins 125 are in two alternating lengths, and equal in pitch. The longer fins number five and the shorter fins number four.

FIG. 4E is an illustration of upstream fins 125 shown in an airflow resistance minimizing pattern, in one embodiment of the present invention. In this example, upstream fins 125 are in two alternating lengths, and equal in pitch. The shorter fins number five and the longer fins number four.

FIG. 4F is an illustration of upstream fins shown in an airflow resistance minimizing pattern, in one embodiment of the present invention. In this example, upstream fins 125 are in a W shape, as indicated by line 130.

Figure 4G:
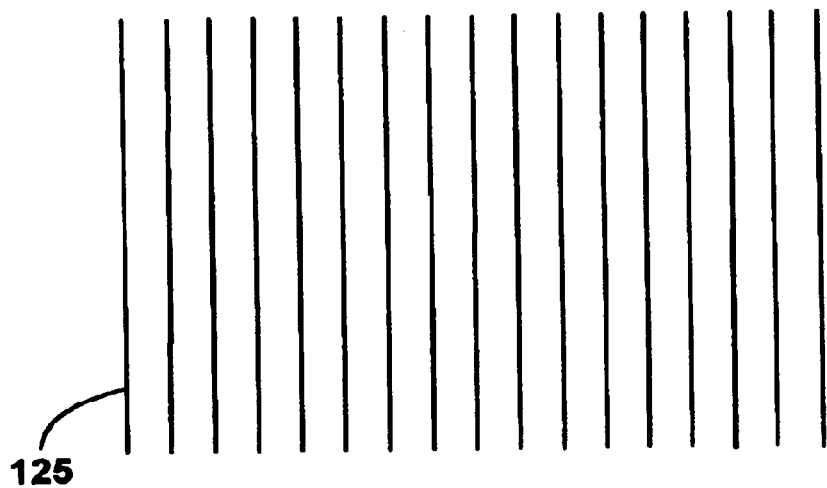
FIG. 4G is an illustration of upstream fins in an alternative configuration, in accordance with one embodiment of the present invention.

FIG. 4G is an illustration of upstream fins shown in an airflow resistance minimizing pattern, in one embodiment of the present invention. In this example, upstream fins 125 are shown of equal length but in a much finer pitch, as compared to the pitch of upstream fins of FIG. 4C.

Figure 4H:
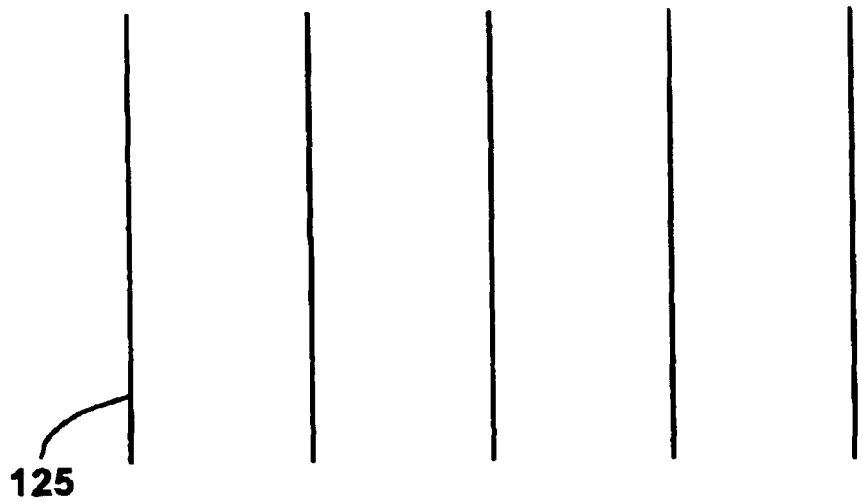
FIG. 4H is an illustration of upstream fins in an alternative configuration, in accordance with one embodiment of the present invention.

FIG. 4H is an illustration of upstream fins shown in an airflow resistance minimizing pattern, in one embodiment of the present invention. In this example, upstream fins 125 are of equal length but in a substantially less fine pitch than upstream fins 125 of FIG. 4C.

Figure 4I:
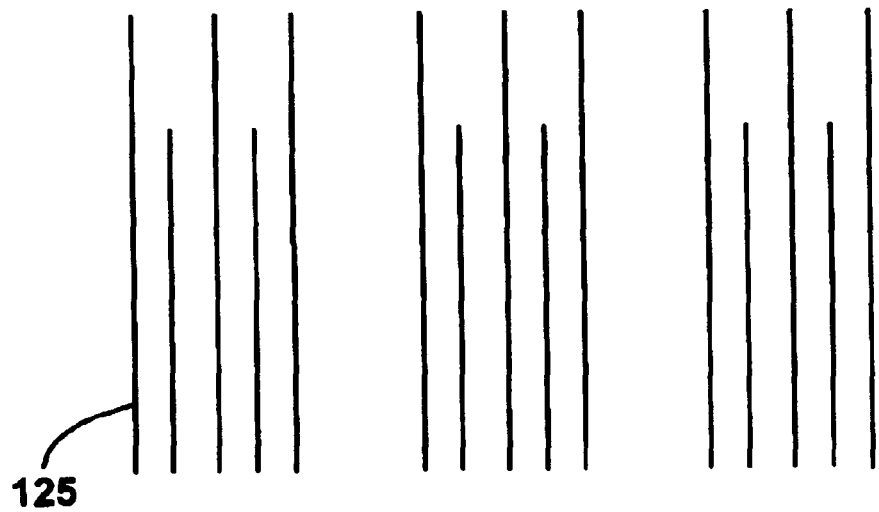
FIG. 4I is an illustration of upstream fins in an alternative configuration, in accordance with one embodiment of the present invention.

FIG. 4I is an illustration of upstream fins shown in an airflow resistance minimizing pattern, in one embodiment of the present invention. In this example, upstream fins 125 are shown in a repeating pattern of unequal lengths with unequal pitch.

Figure 4J:
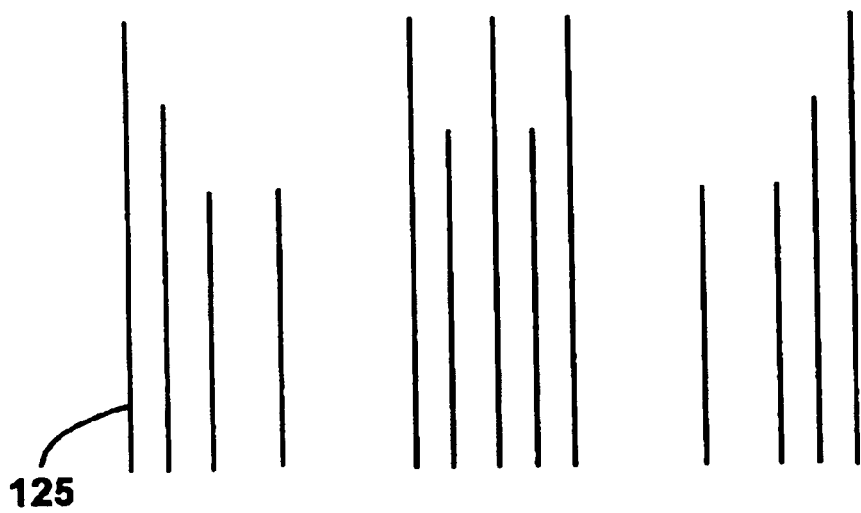
FIG. 4J is an illustration of upstream fins in an alternative configuration, in accordance with one embodiment of the present invention.

FIG. 4J is an illustration of upstream fins shown in an airflow resistance minimizing pattern, in one embodiment of the present invention. In this example, upstream fins 125 are shown in a non-repeating pattern with unequal lengths and unequal pitch.

Referring to FIGS. 4A–4J, in the present embodiment, upstream fins 125 are disposed in configurations that minimize airflow resistance. Airflow resistance is analogous to pressure drop. The pressure drop associated with airflow 50 contacting a first region of cooling fins, e.g., upstream fins 125 is minimized by configuring the first region of cooling fins, in one embodiment upstream fins 125, in an airflow resistance pattern, such as those shown and described in FIG. 3 and FIGS. 4C–4J. In one embodiment, the first region of cooling fins, e.g., upstream fins 125 of FIGS. 2A–2D, is interposed between a second region of cooling fins, e.g., cooling fins 102 of FIG. 2A or cooling fin regions 102*d* and 102*u* of FIGS. 5B and 5C, and incoming airflow 50. In one embodiment, by virtue of the fine pitch of the second region of cooling fins, the second region generates more airflow resistance than the first region of cooling fins. In one embodiment, the first region of cooling fins, upstream fins 125, are adapted to reduce air turbulence associated with airflow velocity, thereby minimizing pressure drop and airflow resistance, increasing airflow volume and effectively increasing velocity of the airflow. It is appreciated that through manipulation of the first region of cooling fins (upstream fins 125), e.g., by configuring upstream fins in an airflow resistance minimizing pattern as shown in FIG. 3 and FIGS. 4C–4J, a maximum volume of airflow with minimum airflow resistance can be directed to a second region of cooling fins, e.g., cooling fins 102 and/or cooling fins 102*u* and 102*d*, thus realizing optimum cooling fin heat dissipation performance. It is further appreciated that the configurations depicted in the above figures (FIGS. 3, 4C–4J) are to be considered exemplary and should not be construed as a limitation to conceivable embodiments of the present invention or to the number of cooling fin banks that can be employed.

Figure 5A:
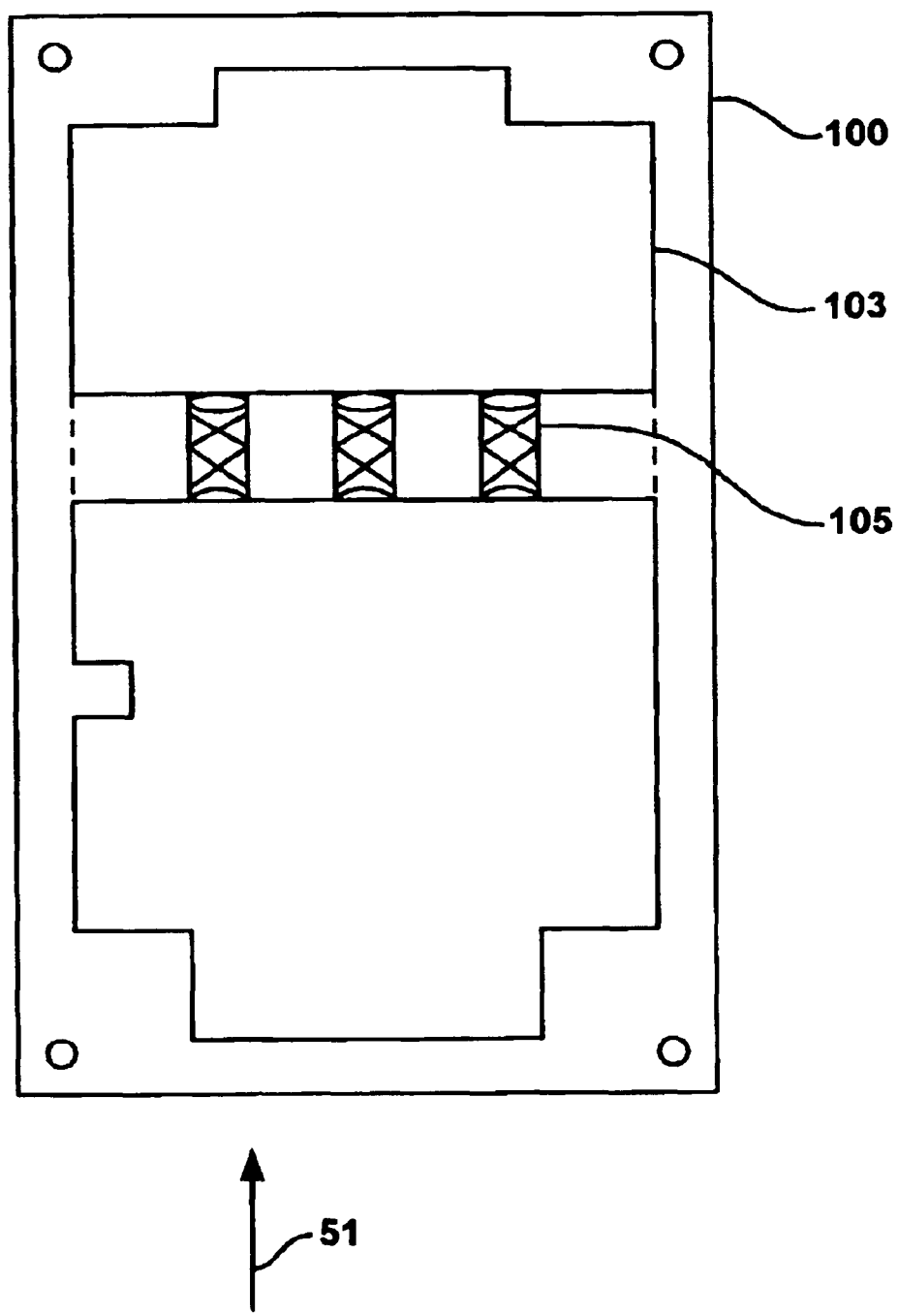
FIG. 5A is an illustrated top-view of a heat sink, removed from a motherboard and shown without air ducts, in accordance with one embodiment of the present invention.

FIG. 5A is an illustrated top-view of a heat sink apparatus, e.g., heat sink apparatus 100 of FIG. 3, shown without air ducts 120 or upstream fins 125, in one embodiment of the present invention. Heat sink apparatus 100 is adapted to be thermally coupled to a microprocessor, e.g., microprocessor 80. Top plate cover 103 is shown and is covering cooling fins 102. A directional airflow is indicated by arrow 51. Heat pipes 105 are also shown and are adapted to provide additional heat dissipation. A heat pipe provides high heat conductivity, such that heat generated by a microprocessor is readily moved to the opposite end of the heat pipe, and therefore also the opposite end of the heat sink apparatus. A heat pipe is a tube or other such structure that has a wicking agent inside and a liquid, e.g., distilled water, is added. The tube is then evacuated and then closed. The liquid boils at a temperature lower than 100 degrees Centigrade. In the area of heat dissipation, the liquid inside the tube boils, and the vapor travels to the other, cooler end of the pipe, and then condenses. This moves the heat, through the latency of vaporization of water, with a nearly imperceptible temperature drop.

Figure 5B:
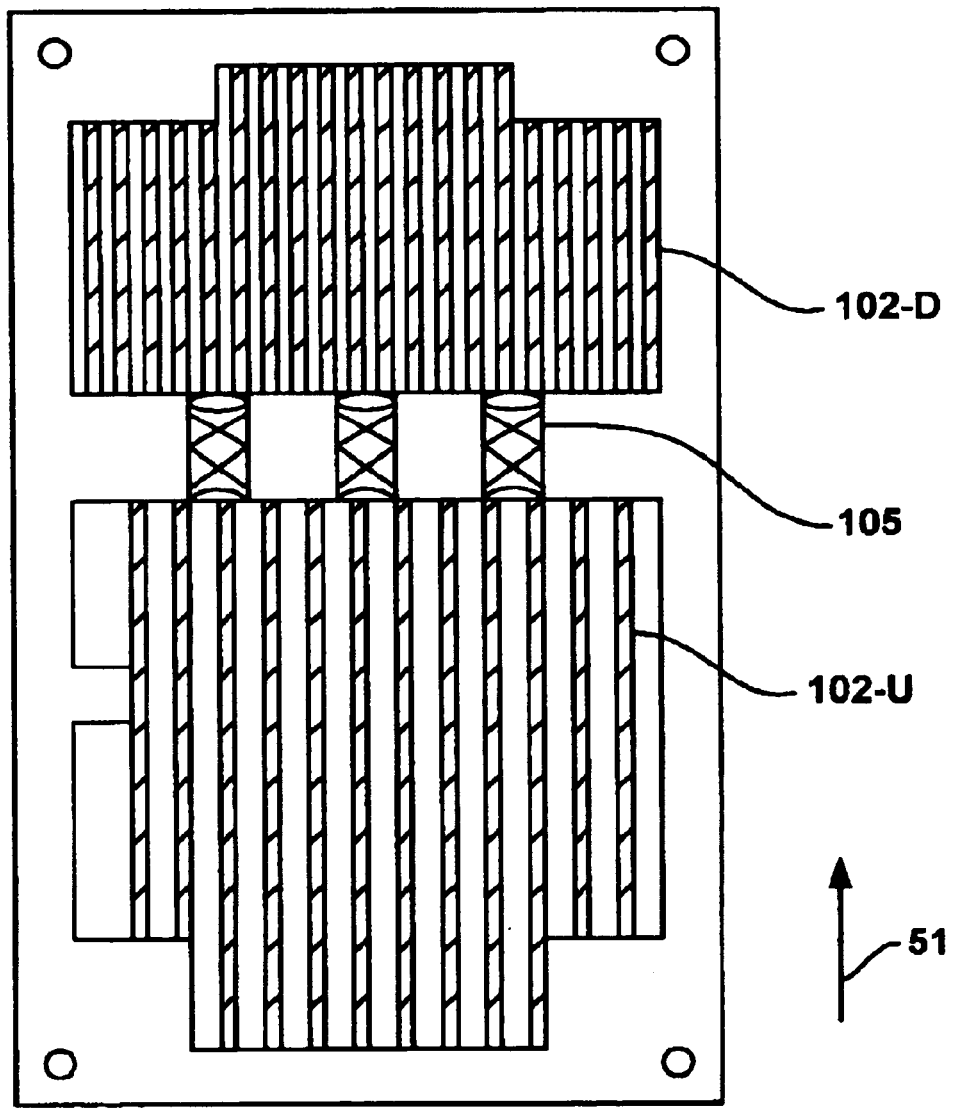
FIG. 5B is an illustrated cut-away top-view of the heat sink of FIG. 5A, in accordance with one embodiment of the present invention.

FIG. 5B is a cut-away view of FIG. 5A; depicting top cover 103 removed and showing a second region of cooling fins 102*u* and 102*d*, in one embodiment of the present invention. Heat pipes 105, analogous to heat pipes 105 of FIG. 5A are shown. Also shown is a directional airflow as indicated by arrow 51. In this embodiment, cooling fins 102*u* are nearer (downstream) of an incoming airflow and cooling fins 102*d* are more distant (more downstream) from an incoming airflow. It is noted that each cooling fin of cooling fins 102*u* is spaced farther apart than each cooling fin of cooling fins 102*d*. In this embodiment, the portion of microprocessor 80 generating less heat is disposed under cooling fins 102*u* and the portion of microprocessor 80 generating more heat is disposed under cooling fins 102*d*. In another embodiment, additional heat sources can be thermally coupled to heat sink apparatus 100. It is appreciated that in another embodiment, cooling fins 102d may be located closer to an incoming airflow and cooling fins 102u may be located more distant to the incoming airflow. It is noted that the portion of microprocessor 80 that generates more heat is disposed under those cooling fins that are spaced closer together, providing a greater surface area with which heat can be dissipated. It is appreciated that, in accordance with one embodiment of the present invention, a first region of cooling fins, e.g., upstream fins 125 of FIGS. 4C–4J, while not shown in FIG. 5B, would be interposed between directional airflow 51 and where airflow 51 first contacts cooling fins 102u.

Figure 5C:
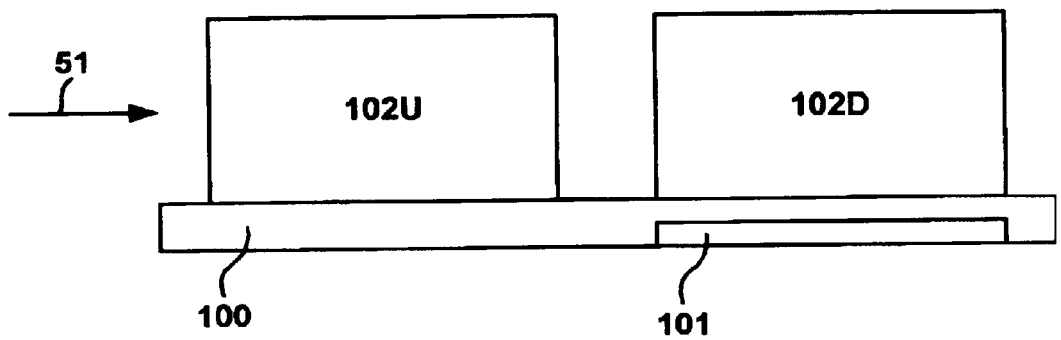
FIG. 5C is an illustrated side view of the heat sink of FIG. 5A, in accordance with one embodiment of the present invention.

It is further appreciated that while FIGS. 5B and 5C depict and describe a second region of cooling fins having two banks of cooling fins, additional numbers of cooling fin banks can be deployed downstream of airflow 50, and as such, the number of cooling fins banks as described in FIGS. 5B and 5C should be considered exemplary in nature, and not construed as limiting as to their number nor their configuration. It FIG. 5C is a side-view illustration of heat sink apparatus 100, in one embodiment of the present invention. In this embodiment, heat sink apparatus 100 is adapted to be thermally coupled to a processor package, e.g., microprocessor 80, configured with a conventional flat top. In one embodiment, heat sink apparatus 100 is configured with a base having a uniform thickness. In one embodiment, cooling fins 102u are shown disposed upstream of an incoming airflow as indicated by arrow 51. In one embodiment, cooling fins 102d are shown located above contacting plate 101. In one embodiment, contacting plate 101 is adapted to be in contact with that portion of microprocessor 80 that generates more heat that is to be dissipated.

Figure 5D:
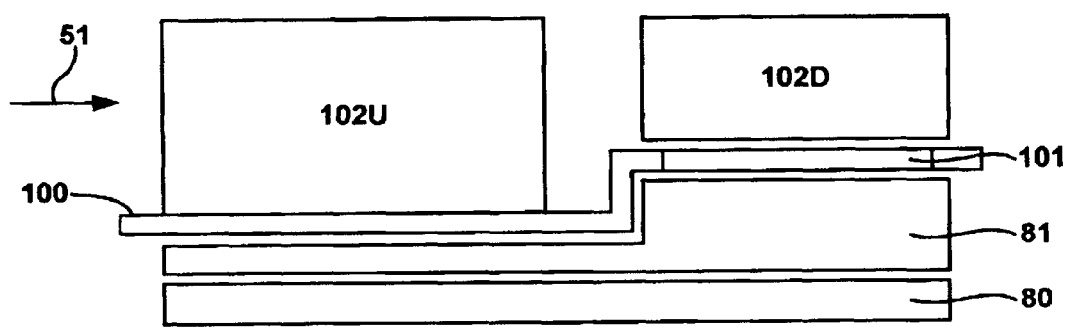
FIG. 5D is an illustrated side view of the heat sink of FIG. 5A, in accordance with another embodiment of the present invention.

FIG. 5D is a side-view illustration of heat sink apparatus, in one embodiment of the present invention. In this embodiment, heat sink apparatus 100 is adapted to be thermally coupled to a processor package, e.g., microprocessor 80, configured with an uneven top. In one embodiment, heat sink apparatus 100 is configured with a step in the base to accommodate heat sources with different thicknesses. In this instance, a processor lid 81 is interposed between heat sink assembly 100 and microprocessor 80. Shown cooling fins 102u and 102d are analogous to cooling fins 102u and 102d of FIG. 5C. In this embodiment, contacting plate 101 is thermally coupled to processor lid 81.

Figure 5E:
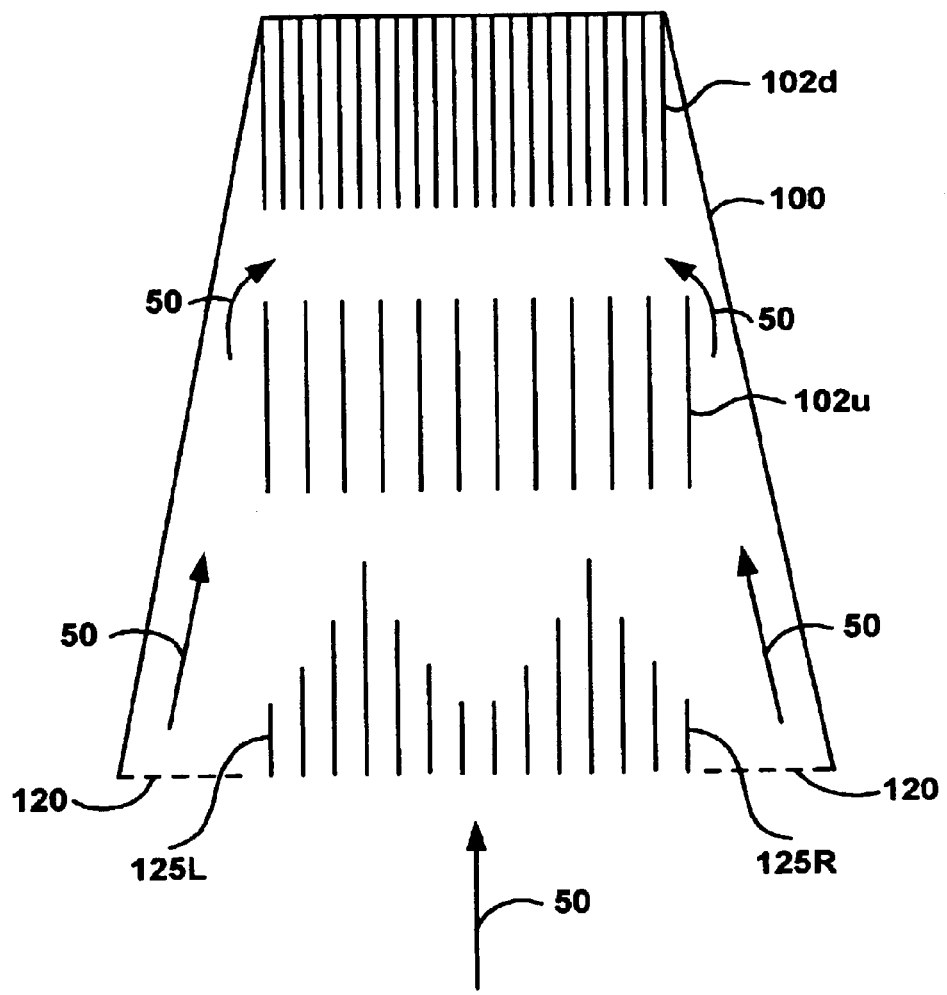
FIG. 5E is an illustrated view of the cooling fins of the heat sink assembly of FIG. 5A depicting airflow deflection, in accordance with one embodiment of the present invention.

FIG. 5E is a top view illustration of cooling fins 102d, cooling fins 102u, upstream fins 125l and 125r, air duct 120 (indicated by a dotted line) and directional incoming airflow 50. As described above, upstream fins 125l and 125r reduce airflow resistance (pressure drop) of airflow 50. Because air duct 120 extends farther horizontally, in this example, than the footprint of the cooling fins, air duct 120 captures more of the available air from airflow 50. By virtue of the angle of air duct 120, that additional portion of airflow 50 captured by air duct 120 does not flow over the surface areas of cooling fins 102u, as such provides cooler air to cooling fins 102d. Additionally, because preheated air, such as that which contacts portions of cooling fins more upstream relative to the airflow direction, the thermal performance of the heat sink is reduced. Embodiments of the present invention enable air to reach the component with the most critical cooling issue, e.g., portions of a microprocessor 80 generating the greater amount of heat, without a temperature increase caused by the system components.

Figure 6:
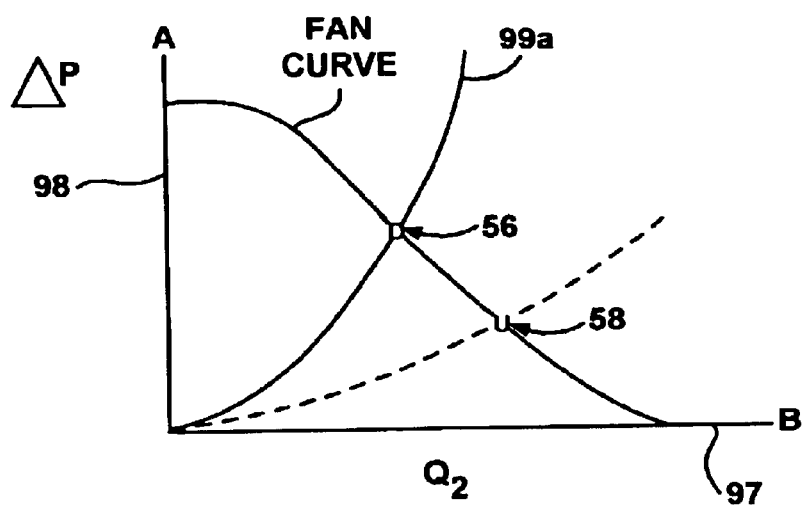
FIG. 6 is a graph illustrating the relationship between airflow and pressure drop in accordance with one embodiment of the present invention.

FIG. 6 is a graph showing the relationship between airflow pressure drop, airflow volume, and an operating point of a heat sink apparatus, in one embodiment of the present invention. Pressure drop, e.g., ΔP 98 represents the defined pressure drop inherent to a fan, e.g., air fan 90 of FIG. 2A, driving air across a heat sink, e.g., heat sink apparatus 100 of FIG. 2A. $Q_2$ 97 represents the flow rate of the airflow provided by air fan 90. In one embodiment, the volume is measured in cubic feet per minute at meters cubed per second. Airflow resistance, also referred to as pressure drop, as related to a heat sink, e.g., heat sink apparatus 100, is indicated by line 99a. Where velocity 98 and volume 97 intersect with line 99, that is the operating point, and is indicated by point 56. If pressure drop 99a is reduced by, for example, the addition of air ducts, e.g., air ducts 120, or modification of the fin pitch or thickness, or manipulation of the pattern in which the cooling fins are disposed, as provided by upstream fins 125 (l and r), pressure drop 99a is reduced, which is indicated by dotted line 99b. By reducing airflow resistance through the implementation of upstream fins, as described above, an increase in airflow volume 97 is achieved. Additionally, by reducing pressure drop associated with airflow turbulence, the effective velocity of the airflow can also be increased. This increases the functionality of the cooling fins to dissipate a greater amount of generated heat.

FIG. 7 is a flowchart 700 of steps performed in accordance with one embodiment of the present invention for providing a heat dissipating apparatus. Flowchart 700 includes processes of the present invention which, in one embodiment, are carried out by components coupled with the heat dissipating apparatus. Although specific steps are disclosed in flowchart 700, such steps are exemplary. That is, the present invention is well suited to performing various other steps or variations of the steps recited in FIG. 7.

In step 702 of FIG. 7, an airflow, e.g., airflow 50 of FIG. 2A, is directed around a plurality of cooling fins, e.g., cooling fins 102 of FIG. 2B, in one embodiment of the present invention. A plurality of cooling fins, e.g., cooling fins 102 are coupled to a heat dissipating apparatus, e.g., heat sink apparatus 100 of FIGS. 2A, 3, 5A, 5B, and 5C. Heat dissipating apparatus 100 is adapted to be thermally coupled to a heat source, e.g., microprocessor 80, in one embodiment of the present invention. An air duct, e.g., air duct 120 of FIG. 2A is adapted to provide redirection of the airflow across cooling fins 102, in one embodiment of the present invention. By redirecting portions of airflow 50 to more downstream portions of the cooling fins, those downstream portions receive cooler air, enabling that portion of the heat sink apparatus with the most critical cooling issues to receive air that has not been pre-heated through contact with system components. In one embodiment, cooling fins 102 are comprised of a second region of cooling fins, e.g., cooling fins 102d, and 102u of FIG. 5b, and a first region of cooling fins, e.g., upstream fins 125 FIG. 3. The plurality of cooling fins, cooling fins 102 and upstream fins 125 are adapted to have air, e.g., airflow 50, traversed about the surface areas thereof. In one embodiment of the present invention, the cooling fins are oriented parallel to the direction of airflow 50.

In step 704 of FIG. 7, the pressure drop associated with airflow 50 contacting cooling fins 102 and upstream fins 125 is minimized by configuring upstream fins 125 in a air turbulence reducing or airflow resistance reducing pattern, such as those shown and described in FIG. 3 and FIGS. 4C–4J. In one embodiment, upstream fins, e.g., upstream fins 125 of FIGS. 2A–2D are interposed between cooling fins 102 and incoming airflow 50. In one embodiment, upstream fins 125 are adapted to reduce air turbulence associated with airflow velocity, thus minimizing pressure drop and increasing the airflow volume which can traverse surface areas of the cooling fins, thereby increasing the heat dissipating performance of the heat sink apparatus. In one embodiment, upstream fins 125 are oriented parallel to an incoming airflow, while in another embodiment, upstream fins may be angled to direct more of the incoming airflow to portions of the heat sink apparatus that are performing a greater amount of heat dissipation, such as is shown and described in FIGS. 4A and 4B. It is appreciated that through manipulation of the upstream fins, e.g., configuring upstream fins in an airflow resistance minimizing pattern, optimum performance of the cooling fins can be realized.

The foregoing descriptions of specific embodiments of the present invention have been presented for purposes of illustration and description. They are not intended to be exhaustive or to limit the invention to the precise forms disclosed, and many modifications and variations are possible in light of the above teaching. The embodiments were chosen and described in order to best explain the principles of the invention and its practical application, to thereby enable others skilled in the art to best utilized the invention and various embodiments with various modifications as are suited to the particular use contemplated. It is intended that the scope of the invention be defined by the claims appended hereto and their equivalents.

What is claimed is:

1. A heat dissipating apparatus comprising:
   a heat sink device having a plurality of cooling fins coupled thereto, said heat sink device adapted to be thermally coupled with a heat source, said plurality of cooling fins adapted to dissipate heat generated by said heat sources and wherein said plurality of cooling fins are disposed in a first region and a second region, wherein said plurality of cooling fins in said first region generate less resistance to said airflow than is generated by said plurality of cooling fins in said second region, an air duct coupled with said heat sink device, said air duct for directing an airflow to said cooling fins to increase dissipation of said heat wherein said air duct directs said airflow through said first region of said plurality of cooling fins, and subsequently through said second region of said plurality of cooling fins; and
   a plurality of upstream fins coupled with said air duct, said plurality of upstream fins upstream of said plurality of cooling fins, said plurality of upstream fins not connected to said heat sink and for providing direction to said airflow with respect to said plurality of cooling fins.

2. The heat dissipating apparatus of claim 1 wherein said second region of said plurality of cooling fins are disposed thermally proximal to said heat source.

3. The heat dissipating apparatus of claim 2 wherein said plurality of upstream fins direct said airflow away from said first region of said plurality of cooling fins and toward said second region of said plurality of cooling fins disposed thermally proximal to said heat source.

4. The heat dissipating apparatus of claim 1 wherein the pitch of said second region of said plurality of cooling fins is finer than the pitch of said first region of said plurality of cooling fins.

5. A heat dissipating apparatus comprising:
   a heat sink device having a plurality of cooling fins, said plurality of cooling fins comprising a first region of cooling fins and a second region of cooling fins, said plurality of cooling fins coupled with said heat sink device, said heat sink device adapted to be thermally coupled with a heat source, said plurality of cooling fins adapted to dissipate heat generated by said heat source;
   an air duct coupled with said heat sink device, said air duct for directing an airflow to said plurality of cooling fins, said airflow directed through said first region of cooling fins and subsequently through said second region of cooling fins, wherein said first region of cooling fins generate less resistance to said airflow than said second region of cooling fins and wherein said first region of cooling fins are disposed in an airflow resistance minimizing pattern; and
   a plurality of upstream fins coupled with said air duct, said plurality of upstream fins upstream of said plurality of cooling fins, said plurality of upstream fins not connected to said heat sink device and for providing direction to said airflow with respect to said plurality of cooling fins.

6. The heat dissipating apparatus of claim 5 wherein said second region of cooling fins are disposed thermally proximal to said heat source.

7. The heat dissipating apparatus of claim 6 wherein said plurality of upstream fins direct said airflow away from said first region of said plurality of cooling fins and toward said second region of said plurality of cooling fins disposed thermally proximal to the hottest portion of said heat source.

8. A heat dissipating apparatus comprising:
   a heat sink device having a plurality of cooling fins coupled thereto, said heat sink device adapted to be thermally coupled with a heat source, said plurality of cooling fins adapted to dissipate heat generated by said heat source, and wherein said plurality of cooling fins are disposed in a first region and a second region, an air duct coupled with said heat sink device, said air duct for directing an airflow to said cooling fins to increase dissipation of said heat wherein said air duct directs said airflow through said first region of said plurality of cooling fins, and subsequently through said second region of said plurality of cooling fins, and wherein the pitch of said second region of said plurality of cooling fins is finer than the pitch of said first region of said plurality of cooling fins; and
   a plurality of upstream fins coupled with said air duct, said plurality of upstream fins upstream of said plurality of cooling fins, said plurality of upstream fins not connected to said heat sink and for providing direction to said airflow with respect to said plurality of cooling fins.

9. The heat dissipating apparatus of claim 8 wherein said plurality of cooling fins in said first region generate less resistance to said airflow than is generated by said plurality of cooling fins in said second region.

10. The heat dissipating apparatus of claim 8 wherein said second region of said plurality of cooling fins are disposed thermally proximal to said heat source.

11. The heat dissipating apparatus of claim 10 wherein said plurality of upstream fins direct said airflow away from said first region of said plurality of cooling fins and toward said second region of said plurality of cooling fins disposed thermally proximal to said heat source.

* * * * *